United States Patent
Zhao

(10) Patent No.: US 10,923,564 B2
(45) Date of Patent: Feb. 16, 2021

(54) SUPER-JUNCTION STRUCTURE AND METHOD FOR MANUFACTURING SAME

(71) Applicant: Shanghai Huahong Grace Semiconductor Manufacturing Corporation, Shanghai (CN)

(72) Inventor: Longjie Zhao, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/444,465

(22) Filed: Jun. 18, 2019

(65) Prior Publication Data

US 2020/0006475 A1 Jan. 2, 2020

(30) Foreign Application Priority Data

Jun. 29, 2018 (CN) .......................... 201810695464.7

(51) Int. Cl.
*H01L 21/00* (2006.01)
*H01L 29/06* (2006.01)
(Continued)

(52) U.S. Cl.
CPC ...... *H01L 29/0634* (2013.01); *H01L 21/3065* (2013.01); *H01L 29/66734* (2013.01)

(58) Field of Classification Search
CPC ........... H01L 29/0634; H01L 29/66734; H01L 29/66477; H01L 29/78
See application file for complete search history.

(56) References Cited

U.S. PATENT DOCUMENTS 4,482,419 A * 11/1984 Tsukada ................. H01J 37/16
156/345.31
8,178,920 B2 * 5/2012 Nakamura .......... H01L 29/0649
257/330
(Continued)

FOREIGN PATENT DOCUMENTS

| CN | 103730372 A | 4/2014 |
| CN | 106816376 A | 6/2017 |
| JP | 2004072068 A | 3/2004 |

OTHER PUBLICATIONS

Search Report issued in First Office Action from corresponding Chinese Patent Application No. 2018106954647, dated Mar. 26, 2020, pp. 1-2.

*Primary Examiner* — Nicholas J Tobergte
(74) *Attorney, Agent, or Firm* — MKG, LLC

(57) ABSTRACT

A super-junction structure is formed by alternately arrayed pluralities of N-pillars and of P-pillars. The P-pillars are formed by P-type materials filled in super-junction trenches. The super-junction trenches are formed in an N-type epitaxial layer, each formed by a bottom trench and a top trench stacked together. A side angle of the bottom trenches is greater than 90°, and the width of the bottom surface of each bottom trench is greater than that of the top surface of the trench. The side angle of the top trenches is smaller than 90°, and the width of the bottom surface of each top trench is smaller than the top surface of the trench. The super-junction trenches are of a waisted structure. The bottom trenches increase the bottom width of the super-junction trenches and improve the depletion of the bottoms of the N-pillars, increasing the breakdown voltage of the super-junction structure.

20 Claims, 3 Drawing Sheets

(51) Int. Cl.
*H01L 21/3065* (2006.01)
*H01L 29/66* (2006.01)

(56) References Cited

U.S. PATENT DOCUMENTS

| | | | | |
|---|---|---|---|---|
| 8,283,720 B2* | 10/2012 | Saito | ................... | H01L 29/7802 257/328 |
| 8,836,028 B2* | 9/2014 | Yedinak | ............ | H01L 29/66734 257/341 |
| 8,890,280 B2* | 11/2014 | Luo | ..................... | H01L 29/0634 257/488 |
| 10,002,836 B2* | 6/2018 | Spitzlsperger | ...... | H01L 21/6835 |
| 10,217,813 B2* | 2/2019 | Hiyoshi | ............ | H01L 21/02576 |
| 10,355,122 B2* | 7/2019 | Abiko | ................. | H01L 29/7802 |

* cited by examiner

SUPER-JUNCTION STRUCTURE AND METHOD FOR MANUFACTURING SAME

CROSS REFERENCE TO RELATED APPLICATION

The present application claims priority to Chinese Patent Application No. 201810695464.7 filed on Jun. 29, 2018, the entirety of which is incorporated by reference herein.

TECHNICAL FIELD

The invention relates to the field of manufacturing of semiconductor integrated circuits, in particular to a super-junction structure and a method for manufacturing a super-junction structure.

BACKGROUND OF THE INVENTION

FIG. 1 is a view of an existing super-junction device. As shown in FIG. 1, the super-junction device comprises a super-junction structure formed by N-pillars (N-type thin layer) 102 and P-pillars (P-type thin layer) 103 which are alternately arrayed. The super-junction structure is generally used as a drift region of the super-junction device which comprises a plurality of device cell structures, and the device cell structures are usually formed on the surface of the super-junction structure.

The super-junction device shown in FIG. 1 is a super-junction MOSFET. Each device cell structure of the super-junction device is as follows: a P-well 104 is formed on the surface of the super-junction structure, and gate structures are formed at the tops of the N-pillars 102, wherein the gate structures shown in FIG. 1 are trench gate structures each comprising a gate trench, a gate dielectric layer (such as a gate oxide layer) formed on the inner surface of the gate trench, and a polysilicon gate 105 filled in the gate trench. Source regions 106 are formed on the surface of the P-well 104 and are N+ doped. A channel is formed in the surface, covered with the side faces of the polysilicon gates 105, of the P-well 104.

In the prior art, the P-pillars 103 are generally formed through trench filling, the trenches corresponding to the P-pillars 103 are super-junction trenches, which are formed in an N-type epitaxial layer such as an N-type silicon epitaxial layer 102 and are usually formed through one time of etching, and in order to facilitate etching and filling, the side faces of the super-junction trenches are inclined. The super-junction trenches are filled with P-type materials such as a P-type silicon epitaxial layer to form the P-pillars 103, and the N-pillars 102 are formed by the portions, between the P-pillars 103, of the N-type epitaxial layer 102. The N-type epitaxial layer 102 is formed on the surface of a semiconductor substrate such as a silicon substrate 101. Generally, drain regions are formed by back N+-doped regions obtained after the back of the silicon substrate 101 is thinned.

In the super-junction structure of the existing super-junction device shown in FIG. 1, as the super-junction trenches are formed through one time of etching and have the inclined side faces, the width of the super-junction trenches is gradually decreased from top to bottom, and consequentially, the bottom width of the super-junction trenches is the smallest. However, the super-junction structure is generally located in a drift region and realizes a high voltage resistance, namely a high breakdown voltage (BV), through transverse depletion between the P-pillars and the N-pillars during biasing reversal. In order to fulfill good transverse depletion between the P-pillars and the N-pillars, charges between the P-pillars and the N-pillars at all positions need to be well matched. However, the reduction of the bottom size of the super-junction trenches inevitably decreases the total quantity of P-type impurities at the bottoms of the P-pillars and increase the total quantity of N-type impurities at the bottoms of the N-pillars, which means that the charges at the bottoms of the P-pillars are mismatched with the charges at the bottoms of the N-pillars, so that the N-type impurities at the bottoms of the N-pillars cannot be completely depleted by the P-type impurities at the bottoms of the P-pillars, and consequentially, the BV of the super-junction structure is reduced. In the prior art, in order to avoid a mismatch, caused by the inclined side faces of the super-junction trenches, of the charges at the bottoms of the P-pillars and the bottoms of the N-pillars, the doping process of the P-pillars or the N-pillars needs to be changed accordingly, and non-uniform doping of the P-pillars or the N-pillars will make the process more complex and improve the process cost.

SUMMARY OF THE INVENTION

The technical issue to be settled by the invention is to provide a super-junction structure with the breakdown voltage capable of being increased and to provide a method for manufacturing a super-junction structure.

To settle the above technical issue, the invention provides a super-junction structure formed by a plurality of N-pillars and a plurality of P-pillars which are alternately arrayed. The P-pillars are formed by P-type materials filled in super-junction trenches. The super-junction trenches are formed in an N-type epitaxial layer. The N-pillars are formed by the portions, between the P-pillars, of the N-type epitaxial layer. The N-type epitaxial layer is formed on the surface of a semiconductor substrate.

Each super-junction trench is formed by a bottom trench and a top trench which are stacked together.

The bottom trenches and the top trenches have trapezoidal sections. The side angle of each bottom trench is the apex angle of the trapezoidal section of the bottom trench. The side angle of each top trench is the apex angle of the trapezoidal section of the top trench.

The side angle of each bottom trench is greater than 90°. The width of the bottom surface of each bottom trench is greater than that of the top surface of the bottom trench.

The side angle of each top trench is smaller than 90°. The width of the bottom surface of each top trench is smaller than the width of the top surface of the top trench.

The bottom surface of each top trench is the top surface of the corresponding bottom trench. The whole super-junction trenches are each of a waisted structure. The bottom trenches increase the bottom width of the super-junction trenches and improve the depletion of the bottoms of the N-pillars, thus, increasing the breakdown voltage of the super-junction structure.

Furthermore, the semiconductor substrate is a silicon substrate, and the N-type epitaxial layer is an N-type silicon epitaxial layer. The P-type materials forming the P-pillars are P-type silicon.

Furthermore, the P-type silicon forming the P-pillars is a P-type silicon epitaxial layer formed through epitaxial growth.

Furthermore, the super-junction trenches are formed by etching the N-type epitaxial layer segment-by-segment twice, wherein the top trenches are formed through primary etching, and the bottom trenches are formed at the bottoms of the top trenches through secondary etching.

Furthermore, the N-type epitaxial layer is formed by a first N-type epitaxial layer and a second N-type epitaxial layer which are stacked together, wherein the bottom trenches are formed in the first N-type epitaxial layer through secondary etching, the second epitaxial layer is formed after the bottom trenches are filled with the P-type materials of the P-pillars, and the top trenches are formed in the second epitaxial layer through primary etching.

Furthermore, the primary etching and the secondary etching are dry etching.

Furthermore, the etching angle for the primary etching is smaller than 90°, so that the side angle of each top trench is smaller than 90°. The etching angle for the secondary etching is greater than 90°, so that the side angle of each bottom trench is greater than 90°.

Furthermore, the distance between the top surface and the bottom surface of each bottom trench is smaller than or equal to the distance between the top surface and the bottom surface of each top trench.

To settle the above technical issue, the invention provides a method for manufacturing a super-junction structure. The method comprises the following steps:

Step 1, providing a semiconductor substrate formed with an N-type epitaxial layer on the surface, and defining formation areas of the super-junction trenches by photolithography process;

Step 2, carrying out primary etching according to according to the photolithography process's definition to form top trenches in the N-type epitaxial layer, wherein the side angle of the each top trench is smaller than 90°, the width of the bottom surface of each top trench is smaller than that of the top surface of the top trench, each top trench has a trapezoidal section, and the side angle of each top trench is the apex angle of the trapezoidal section of the top trench;

Step 3, carrying out secondary etching to form bottom trenches in portions, at the bottoms of the top trenches, of the N-type epitaxial layer, and stacking the bottom trenches and the top trenches together to form the super-junction trenches;

Wherein, the side angle of each bottom trench is greater than 90°, the width of the bottom surface of each bottom trench is greater than that of the top surface of the bottom trench, and the bottom surface of each top trench is the top surface of the corresponding bottom trench;

Each bottom trench has a trapezoidal section, and the side angle of each bottom trench is the apex angle of the trapezoid section of the bottom trench;

Step 4, filling the super-junction trenches with P-type materials, wherein P-pillars are formed by the P-type materials filled in the super-junction trenches, N-pillars are formed by the portions, between the P-pillars, of the N-type epitaxial layer, and the multiple N-pillars and the multiple P-pillars are alternately arrayed to form a super-junction structure.

The whole super-junction trenches are each of a waisted structure, and the bottom trenches increase the bottom width of the super-junction trenches and improve the depletion of the bottoms of the N-pillars, thus, increasing the breakdown voltage of the super-junction structure.

To settle the above technical issue, the invention provides a method for manufacturing a super-junction structure. The method comprises the following steps:

Step 1, providing a semiconductor substrate formed with a first N-type epitaxial layer on the surface, and defining formation areas of the super-junction trenches by photolithography process;

Step 2, carrying out secondary etching according to the photolithography process's definition to form bottom trenches in the first N-type epitaxial layer, wherein the side angle of each bottom trench is greater than 90°, the width of the bottom surface of each bottom trench is greater than that of the top surface of the bottom trench, each bottom trench has a trapezoidal section, and the side angle of each bottom trench is the apex angle of the trapezoidal section of the bottom trench;

Step 3, filling the bottom trenches with P-type materials;

Step 4, forming a second N-type epitaxial layer through epitaxial growth on the surface of the first N-type epitaxial layer, and stacking the first N-type epitaxial layer and the second N-type epitaxial layer together to form an N-type epitaxial layer;

Step 5, carrying primary etching according to the photolithography process's definition to form top trenches in the second N-type epitaxial layer, wherein the side angle of each top trench is smaller than 90°, the width of the bottom surface of each top trench is smaller than that of the top surface of the top trench, each top trench has a trapezoidal section, and the side angle of each top trench is the apex angle of the trapezoidal section of the top trench;

Wherein, the bottom surface of each top trench is the top surface of the corresponding bottom trench, and the bottom trenches and the top trenches are stacked together to from the super-junction trenches;

Step 6, filling the top trenches with P-type materials, wherein P-pillars are formed by the P-type materials filled in the super-junction trenches, N-pillars are formed by the portions, between the P-pillars, of the N-type epitaxial layer, and the multiple N-pillars and the multiple P-pillars are alternately arrayed to form a super-junction structure.

The whole super-junction trenches are each of a waisted structure, and the bottom trenches increase the bottom width of the super-junction trenches and improve the depletion of the bottoms of the N-pillars, thus, increasing the breakdown voltage of the super-junction structure.

Furthermore, the semiconductor substrate is a silicon substrate, and the N-type epitaxial layer is an N-type silicon epitaxial layer.

Furthermore, the P-type materials of the P-pillars are a P-type silicon epitaxial layer.

Furthermore, the primary etching and the secondary etching are dry etching.

Furthermore, the etching angle for the primary etching is smaller than 90°, so that the side angle of each top trench is smaller than 90°; the etching angle for the secondary etching is greater than 90°, so that the side angle of each bottom trench is greater than 90°.

Furthermore, an etching device used for the primary etching and an etching device used for the secondary etching are of different types, and after the primary etching is completed, the semiconductor substrate needs to be transferred into the etching device used for the secondary etching so as to carry out the secondary etching.

Furthermore, the distance between the top surface and the bottom surface of each bottom trench is smaller than or equal to the distance between the top surface and the bottom surface of each top trench.

In the invention, the process of the trenches (namely the super-junction trenches) of the super-junction structure is specially designed, and the super-junction trenches are divided into the bottom trenches and the top trenches rather than being of an inverted trapezoid structure formed through one time of etching, wherein the side angle of the top trenches is smaller than 90° while the side angle of the bottom trenches is greater than 90°, so that the width of the top trenches is gradually decreased from top to bottom, the width of the bottom trenches is gradually increased from top to bottom, and thus, the super-junction trenches are of a waisted structure, which is able to increase the bottom width of the super-junction trenches and to improve the depletion of the bottoms of the N-pillars, and accordingly, the breakdown voltage of the super-junction structure is increased.

In addition, the super-junction trenches are formed by etching the N-type epitaxial layer segment-by-segment; or the N-type epitaxial layer is formed by the first N-type epitaxial layer and the second N-type epitaxial layer which are stacked together, the bottom trenches are formed in the first N-type epitaxial layer, then the second N-type epitaxial layer is formed, and finally, the top trenches are formed in the second N-type epitaxial layer. In this way, the invention can be implemented without changing the doping process of the P-pillars or the N-pillars and thus has the advantages of simple process and low process cost.

BRIEF DESCRIPTION OF THE DRAWINGS

The invention is further expounded below with reference to the accompanying drawings and specific embodiments.

DETAILED DESCRIPTION OF PREFERRED EMBODIMENTS OF THE INVENTION

Figure 1:
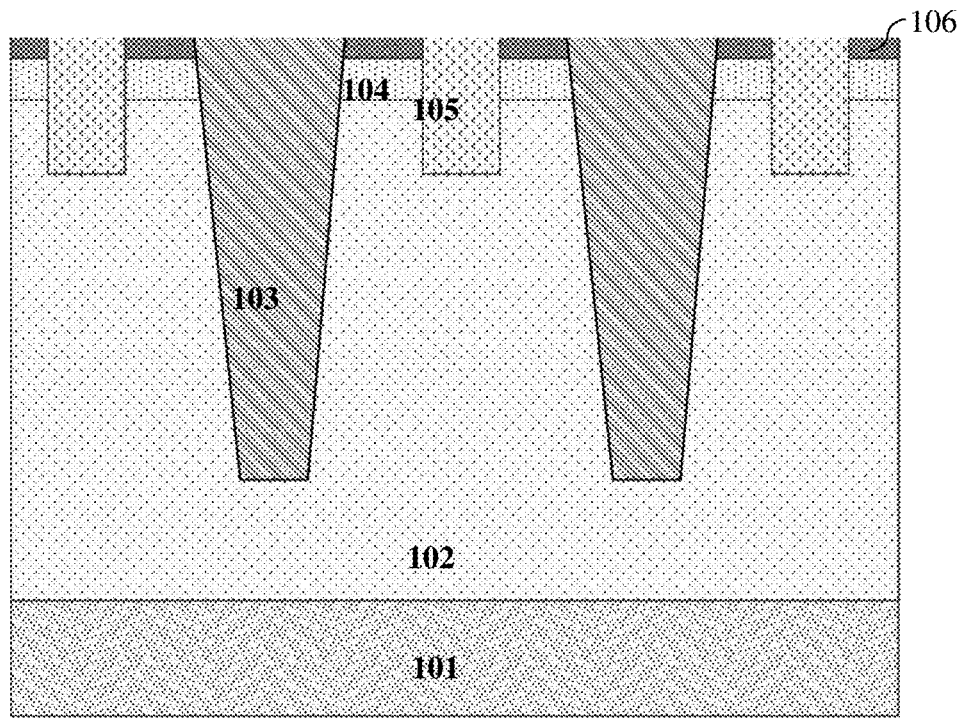
FIG. 1 is a view of an existing super-junction device.
Figure 2:
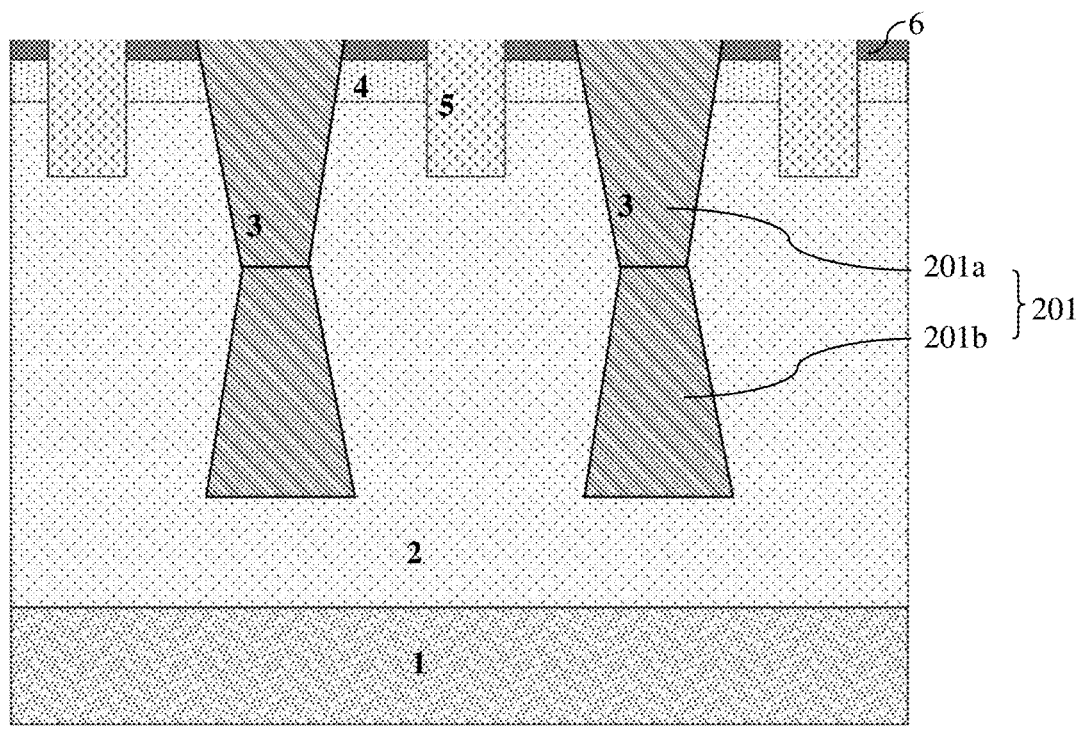
FIG. 2 is a view of a super-junction device in one embodiment of the invention.

FIG. 2 is a view of a super-junction device in one embodiment of the invention. As shown in FIG. 2, the super-junction structure in this embodiment is formed by a plurality of N-pillars 2 and a plurality of P-pillars 3, wherein the N-pillars 2 and the P-pillars 3 are alternately arrayed. The P-pillars 3 are formed by P-type materials filled in super-junction trenches 201. The super-junction trenches 201 are formed in an N-type epitaxial layer 2. The N-pillars 2 are formed by the portions, between the P-pillars 3, of the N-type epitaxial layer 2. The N-type epitaxial layer 2 is formed on the surface of a semiconductor substrate 1.

In this embodiment, the semiconductor substrate 1 is a silicon substrate, and the N-type epitaxial layer 2 is an N-type silicon epitaxial layer. The P-type materials forming the P-pillars 3 are P-type silicon such as a P-type silicon epitaxial layer formed through epitaxial growth.

Each super-junction trench 201 is formed by a bottom trench 201b and a top trench 201a which are stacked together.

The bottom trenches 201b and the top trenches 201a have trapezoidal sections. The side angle of each bottom trench 201b is the apex angle of the trapezoidal section of the bottom trench 201b. The side angle of each top trench 201a is the apex angle of the trapezoidal section of the top trench 201a.

The side angle of each bottom trench 201b is greater than 90°. The width of the bottom surface of each bottom trench 201b is greater than that of the top surface of the bottom trench 201b.

The side angle of each top trench 201a is smaller than 90°. The width of the bottom surface of each top trench 201a is smaller than that of the top surface of the top trench 201a.

The bottom surface of each top trench 201a is the top surface of the corresponding bottom trench 201b. The whole super-junction trench 201 is of a waisted structure. The bottom trenches 201b increase the bottom width of the super-junction trenches 201 and improve the depletion of the bottoms of the N-pillars 2, thus, increasing the breakdown voltage of the super-junction structure.

In this embodiment, the super-junction trenches are formed by etching the N-type epitaxial layer 2 segment-by-segment twice. The top trenches 201a are formed through primary etching. The bottom trenches 201b are formed at the bottoms of the top trenches 201a through secondary etching. In other embodiments, the N-type epitaxial layer 2 is formed by a first N-type epitaxial layer and a second N-type epitaxial layer which are stacked together, the bottom trenches 201b are formed in the first N-type epitaxial layer through secondary etching, the second epitaxial layer is formed after the bottom trenches 201b are filled with the P-type materials of the P-pillars 3, and the top trenches 201a are formed in the second epitaxial layer through primary etching.

The primary etching and the secondary etching are dry etching.

The etching angle for the primary etching is smaller than 90°, so that the side angle of each top trench 201a is smaller than 90°. The etching angle for the secondary etching is greater than 90°, so that the side angle of each bottom trench 201b is greater than 90°. In this embodiment of the invention, the side angle of each bottom trench 201b is greater than and close to 90° (slightly greater than 90°), and the side angle of each top trench 201a is smaller than and close to 90° (slightly smaller than 90°).

The distance between the top surface and the bottom surface of each bottom trench 201b is smaller than or equal to the distance between the top surface and the bottom surface of the each top trench 201a. In FIG. 2, the distance between the top surface and the bottom surface of each bottom trench 201b is approximately equal to the distance between the top surface and the bottom surface of each top trench 210a.

In this embodiment, the process of the trenches (namely the super-junction trenches 201) of the super-junction structure is specially designed, and the super-junction trenches 201 are divided into the bottom trenches 201b and the top trenches 201a rather than being of an inverted trapezoid structure formed through one time of etching, wherein the side angle of the top trenches 201a is smaller than 90° while the side angle of the bottom trenches 201b is greater than 90°, so that the width of the top trenches 201a is gradually decreased from top to bottom, the width of the bottom trenches 201b is gradually increased from top to bottom, and thus, the super-junction trenches 201 are of a waisted structure, which is able to increase the bottom width of the super-junction trenches 201 and to improve the depletion of the bottoms of the N-pillars 2, and accordingly, the breakdown voltage of the super-junction structure is increased.

In addition, in this embodiment, the super-junction trenches 201 are formed by etching the N-type epitaxial layer 2 segment-by-segment; or the N-type epitaxial layer 2 is formed by the first N-type epitaxial layer and the second N-type epitaxial layer which are stacked together, the bottom trenches 201b are formed in the first N-type epitaxial layer, then the second N-type epitaxial layer is formed, and finally, the top trenches 201a are formed in the second N-type epitaxial layer. This embodiment of the invention can be implemented without changing the doping process of the P-pillars or the N-pillars, and thus, the invention has the advantages of simple process and low process cost.

The super-junction structure in this embodiment is applied to a drift region of a device adopting the super-junction structure. The device adopting the super-junction structure is called a super-junction device. The super-junction device shown in FIG. 2 is a super-junction MOSFET. As shown in FIG. 2, the super-junction device comprises a plurality of device cell structures. A P-well 4 is formed on the surface of the super-junction structure. Gate structures are formed at the tops of the N-pillars 2. The gate structures shown in FIG. 2 are gate trench structures each comprising a gate trench, a gate dielectric layer (such as a gate oxide layer) formed on the inner surface of the gate trench, and a polysilicon gate 5 filled in the gate trench. Source regions 6 are formed on the surface of the P-well 4, wherein the source regions 6 are N+ doped. A channel is formed in the surface, covered by the side faces of the polysilicon gates 5, of the P-well 4. Drain regions are formed by back N+-doped region obtained after the back of the silicon substrate 1 is thinned.

Figure 3A:
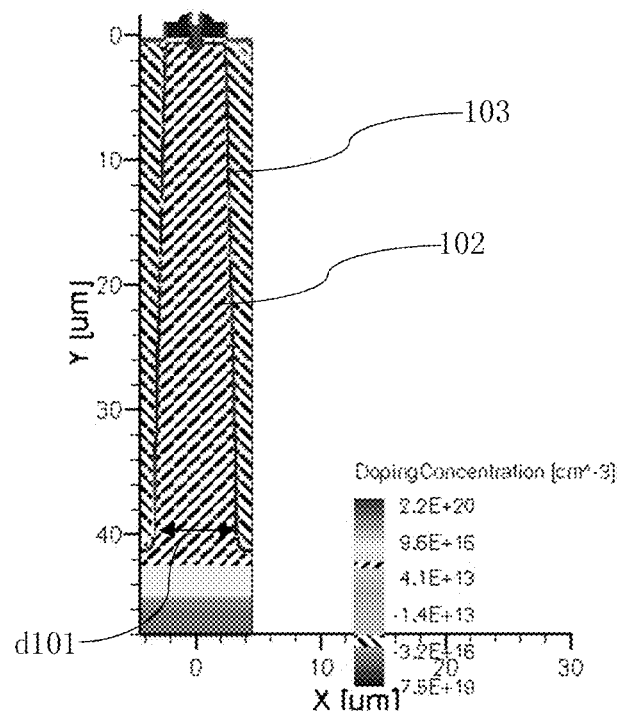
FIG. 3A is a structure simulation diagram of the existing super-junction device.
Figure 3B:
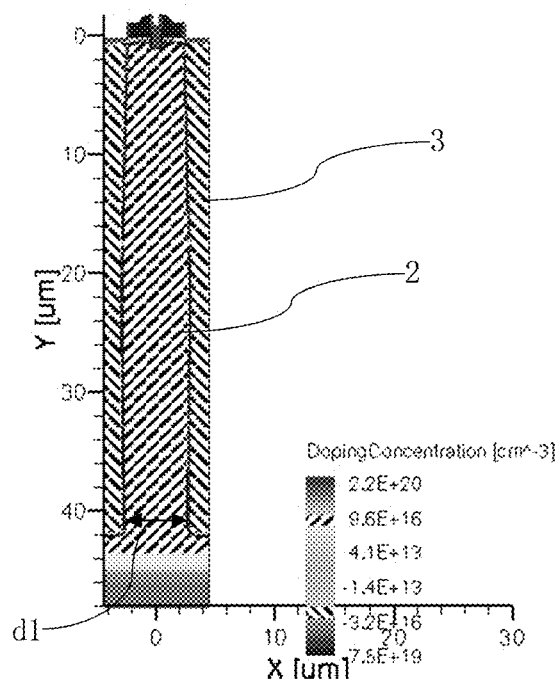
FIG. 3B is a structure simulation diagram of the super-junction device in the embodiment of the invention.

In order to verify the differences of the super-junction device in this embodiment from the existing super-junction device, the following simulation verification is carried out:

1. FIG. 3A is a structure simulation diagram of the existing super-junction device, and FIG. 3B is a structure simulation diagram of the super-junction device in this embodiment; the original simulation diagrams are kromograms in which the doping densities of all regions of the devices are indicated by different colors; and after the original simulation diagrams are printed into black-white diagrams, the doping densities of different regions are indicated by different grayscales. FIG. 3A shows the simulation structure of the N-pillar 102 and the P-pillar 103, and as can be seen from FIG. 3A, the N-pillar 102 has a large bottom width d101, which corresponds to the P-pillar 103 with an inclined side face and a smaller bottom width.

FIG. 3B show the simulation structure of the N-pillar 2 and the P-pillar 3, and as can be seen from FIG. 3B, the bottom width dl of the N-pillar 2 is not increased, which corresponds to the waisted structure of the P-pillar 3 in this embodiment, so that the bottom of the P-pillar 3 in this embodiment is kept wide, the embodiment of the invention can realize that the widths of the positions of the N-type column 2 and the P-type column 3 are substantially the same as the bottom portion, and thus, charges of the N-pillar 2 and the P-pillar 3 are well matched at the bottom of the super-junction structure.

Figure 4:
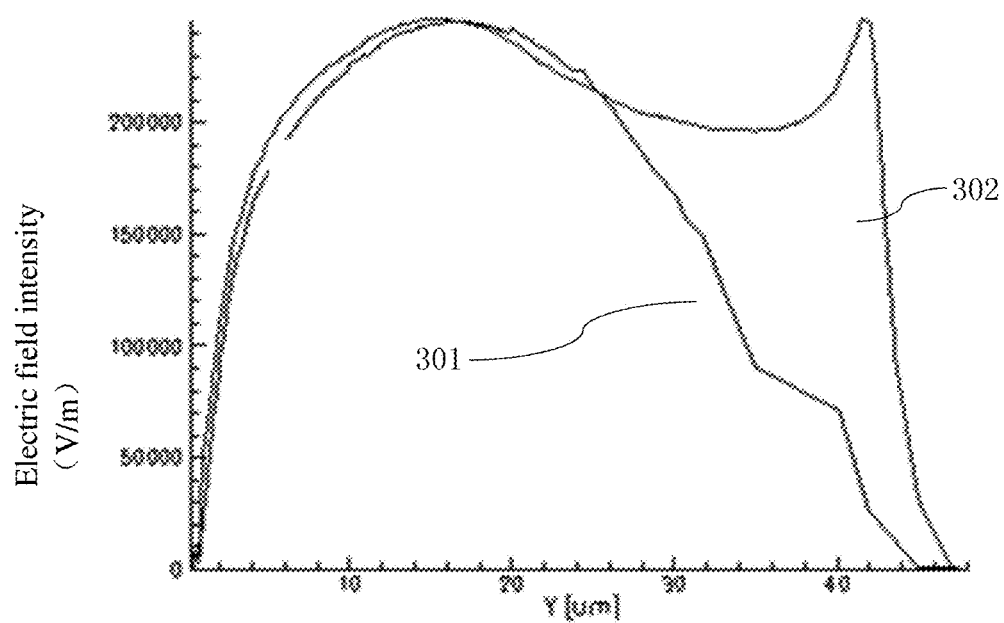
FIG. 4 shows simulation curves of the electric field intensity of N-pillars of the super-junction device in the embodiment of the invention and the electric field intensity of N-pillars of the existing super-junction device.

2. FIG. 4 shows simulation curves of the electric field intensity of the N-pillars of the super-junction device in this embodiment and the electric field intensity of the N-pillars of the existing super-junction device.

Curve 301 is the simulation curve of the electric field intensity of the N-pillars 102 of the existing super-junction device, and as can be seen from curve 301, the electric field intensity at the bottom of the N-pillars 102 is decreased.

Curve 302 is the simulation curve of the electric field intensity of the N-pillars 2 of the super-junction device in this embodiment, and as can be seen from curve 302, the electric field intensity at the bottom of the N-pillars 2 is maintained or increased. Thus, the breakdown voltage of the super-junction structure in this embodiment is increased.

In a first embodiment of the invention, a method for manufacturing a super-junction structure comprises the following steps:

Step 1, a semiconductor substrate 1 formed with an N-type epitaxial layer 2 on the surface is provided, and defining formation areas of the super-junction trenches 201 by photolithography process.

In the first embodiment of the method of the invention, the semiconductor substrate 1 is a silicon substrate, and the N-type epitaxial layer 2 is an N-type silicon epitaxial layer.

Step 2, primary etching is carried out according to the photolithography process's definition to form top trenches 201a in the N-type epitaxial layer 2, wherein the side angle of each top trench 201a is smaller than 90°, and the width of the bottom surface of each top trench 201a is smaller than that of the top surface of the top trench 201a.

Each top trench 201a has a trapezoidal section, and the side angle of each top trench 201a is the apex angle of the trapezoidal section of the top trench 201a.

The primary etching is dry etching.

The etching angle for the primary etching is smaller than 90°, so that the side angle of each top trench 201a is smaller than 90°.

The primary etching is carried out in a first type of etching device, and process parameters of the primary etching are set in a process menu in the first type of etching device.

Step 3, secondary etching is carried out to form bottom trenches 201b in the portions, at the bottoms of the top trenches 201a, of the N-type epitaxial layer 2, wherein the bottom trenches 201b and the top trenches 201a are stacked together to form the super-junction trenches 201.

The side angle of each bottom trench 201b is greater than 90°, and the width of the bottom surface of each bottom trench 201b is greater than that of the top surface of the bottom trench 201b. The bottom surface of each top trench 201a is the top surface of the corresponding bottom trench 201b.

Each bottom trench 201b has a trapezoidal section, and the side angle of each bottom trench 201b is the apex angle of the trapezoidal section of the bottom trench 201b.

The secondary etching is dry etching.

The etching angle for the secondary etching is greater than 90°, so that the side angle of each bottom trench 201b is greater than 90°.

The distance between the top surface and the bottom surface of each bottom trench 201b is smaller than or equal to the distance between the top surface and the bottom surface of each top trench 201a.

When the secondary etching is carried out, the semiconductor substrate 1 needs to be transferred into a second type of etching device used for secondary etching, and process parameters of the secondary etching are set in a process menu in the second type of etching device. As the process parameters of the primary etching are different from the process parameters of the secondary etching, the process menu for the primary etching is different from the process menu for the secondary etching.

Step 4, the super-junction trenches 201 are filled with P-type materials, wherein P-pillars 3 are formed by the P-type materials filled in the super-junction trenches 201, N-pillars 2 are formed by the portions, between the P-pillars 3, of the N-type epitaxial layer 2, and the multiple N-pillars 2 and the multiple P-pillars 3 are alternately arrayed to form a super-junction structure.

In the first embodiment of the method of the invention, the P-type materials of the P-pillars 3 are a P-type silicon epitaxial layer, and the super-junction trenches 201 are filled with the P-type silicon epitaxial layer grown through an epitaxial process.

The whole super-junction trenches 201 are of a waisted structure. The bottom trenches 201b increase the bottom width of the super-junction trenches 201 and improve the depletion of the bottoms of the N-type pillars 2, thus, increasing the breakdown voltage of the super-junction structure.

After the super-junction structure is formed, the following process is carried out to form a super-junction device comprising the super-junction structure. The super-junction device shown in FIG. 2 is an N-type super-junction MOSFET and comprises a plurality of device cell structures. The process comprises the following steps:

A P-well 4 is formed on the surface of the super-junction structure.

Gate structures are formed at the tops of the N-pillars 2, particularly, gate trenches are formed, gate dielectric layers (such as gate oxide layers) are formed on the inner surfaces of the gate trenches, and the gate trenches are filled with polysilicon gates 5.

Afterwards, front N+ doping is carried out to form source regions 6, wherein the source regions 6 are self-aligned with the side faces of the polysilicon gates 5.

Afterwards, an interlayer film, contact holes and a front metal layer are formed, and the front metal layer is photo-etched to form sources and gates with the front metal layer, wherein the sources are connected with the corresponding source regions 6 via the corresponding contact holes, and the gates are connected with the corresponding polysilicon gates 5 via the corresponding contact holes.

After the front process is completed as above, the back process is carried out as follows:

The back of the silicon substrate 1 is thinned.

After the back of the silicon substrate 1 is thinned to a required thickness, N+ doping is carried out on the back of the silicon substrate 1 to form drain regions.

A back metal layer is formed on the back of the drain regions to lead out drains.

In a second embodiment, the method for manufacturing a super-junction structure comprises the following steps:

Step 1, a semiconductor substrate 1 formed with a first N-type epitaxial layer on the surface is provided, and defining formation areas of the super-junction trenches 201 by photolithography process.

In the second embodiment of the method of the invention, the semiconductor substrate 1 is a silicon substrate, and the first N-type epitaxial layer is a first N-type silicon epitaxial layer.

Step 2, secondary etching is carried out according to the photolithography process's definition to form bottom trenches 201b in the first N-type epitaxial layer, wherein the side angle of each bottom trench 201b is greater than 90°, the width of the bottom surface of each bottom trench 201b is greater than that of the top surface of the bottom trench 201b, each bottom trench 201b is trapezoidal section, and the side angle of each bottom trench 201b is the apex angle of the trapezoidal section of the bottom trench 201b.

The secondary etching is dry etching.

The etching angle for the secondary etching is greater than 90°, so that the side angle of each bottom trench 201b is greater than 90°.

When the secondary etching is carried out, the semiconductor substrate 1 needs to be transferred into a second type of etching device used for the secondary etching, and the process parameters of the secondary etching are set in a process menu in the second type of etching device.

Step 3, the bottom trenches 201b are filled with P-type materials, wherein the P-type materials are P-type silicon and are a P-type silicon epitaxial layer formed through an epitaxial process.

Step 4, a second N-type epitaxial layer is formed through epitaxial growth on the surface of the first N-type epitaxial layer, and the first N-type epitaxial layer and the second N-type epitaxial layer are stacked together to form an N-type epitaxial layer 2, wherein the second N-type epitaxial layer is a second N-type silicon epitaxial layer, so that the N-type epitaxial layer 2 is an N-type silicon epitaxial layer.

Step 5, primary etching is carried out according to the photolithography process's definition to form top trenches 201a in the second N-type epitaxial layer, wherein the side angle of each top trench 201a is smaller than 90°, the width of the bottom surface of each top trench 201a is smaller than that of the top surface of the top trench 201a, each top trench 201a has a trapezoidal section, and side angle of each top trench 201a is the apex angle of the trapezoidal section of the top trench 201a.

The bottom surface of each top trench 201a is the top surface of the corresponding bottom trench 201b. The bottom trenches 201b and the top trenches 201a are stacked together to form the super-junction trenches.

The primary etching is dry etching.

The etching angle for the primary etching is smaller than 90°, so that the side angle of each top trench 201a is smaller than 90°.

The primary etching is carried out in a first type of etching device, and process parameters of the primary etching are set in a process menu in the first type of etching device. In this embodiment, as the process parameters of the primary etching are different from the process parameters of the secondary etching, the process menu for the primary etching is different from the process menu for the secondary etching.

Step 6, the top trenches 201a are filled with P-type materials, wherein like in step 3, the P-type materials are P-type silicon and are a P-type silicon epitaxial layer formed through the epitaxial process, P-pillars 3 are formed by the P-type materials filled in the super-junction trenches, N-pillars 2 are formed by the portions, between the P-pillars 3, of the N-type epitaxial layer 2, and the multiple N-pillars 2 and the multiple P-pillars 3 are alternately arrayed to form a super-junction structure.

The whole super-junction trenches are each of a waisted structure, and the bottom trenches 201b increase the bottom width of the super-junction trenches and improve the depletion of the bottoms of the N-pillars 2, thus, increasing the breakdown voltage of the super-junction structure.

After the super-junction structure is formed, the following process is carried out to form a super-junction device comprising the super-junction structure. The super-junction device shown in FIG. 2 is an N-type super-junction MOSFET and comprises a plurality of device cell structures. The process comprises the following steps:

A P-well 4 is formed on the surface of the super-junction structure.

Gate structures are formed at the tops of the N-pillars 2, particularly, gate trenches are formed, gate dielectric layers such as gate oxide layers are formed on the inner surfaces of the gate trenches, and the gate trenches are filled with polysilicon gates 5.

Afterwards, front N+ doping is carried out to form source regions 6, wherein the source regions 6 are self-aligned with the side faces of the polysilicon gates 5.

Afterwards, an interlayer film, contact holes and a front metal layer are formed, and the front metal layer is photo-etched to form sources and gates with the front metal layer, wherein the sources are connected with the corresponding source regions 6 via the corresponding contact holes, and the gates are connected with the corresponding polysilicon gates 5 via the corresponding contact holes.

The invention is expounded above with reference to the specific embodiments, but these embodiments are not intended to limit the invention. Various transformations and improvements made by those skilled in this field without deviating from the principle of the invention should also fall within the protection scope of the invention.

What is claimed is:

1. A super-junction structure, wherein the super-junction structure is formed by a plurality of N-pillars and a plurality of P-pillars which are alternately arrayed, the P-pillars are formed by P-type materials filled in super-junction trenches, the super-junction trenches are formed in an N-type epitaxial layer, the N-pillars are formed by portions, between the P-pillars, of the N-type epitaxial layer, and the N-type epitaxial layer is formed on a surface of a semiconductor substrate;
   each said super-junction trench is formed by a bottom trench and a top trench which are stacked together;
   the bottom trenches and the top trenches have trapezoidal sections, a side angle of each said bottom trench is an apex angle of the trapezoidal section of the bottom trench, and a side angle of each said top trench is an apex angle of the trapezoidal section of the top trench;
   the side angle of each said bottom trench is greater than 90°, and a width of a bottom surface of each said bottom trench is greater than that of a top surface of the bottom trench;
   the side angle of each said top trench is smaller than 90°, and a width of a bottom surface of each said top trench is smaller than that of a top surface of the top trench;
   the super-junction trenches are formed by etching the N-type epitaxial layer segment-by-segment twice from a side of the N-type epitaxial layer spaced from and opposing the semiconductor substrate, the top trenches are formed through primary etching, and the bottom trenches are formed at bottoms of the top trenches through secondary etching;
   the primary etching and the secondary etching are dry etching;
   an etching angle for the primary etching is smaller than 90°, so that the side angle of each said top trench is smaller than 90°; and an etching angle for the secondary etching is greater than 90°, so that the side angle of each said bottom trench is greater than 90°; and
   the bottom surface of each said top trench is the top surface of the corresponding bottom trench, the whole super-junction trenches are each of a waisted structure, and the bottom trenches increase a bottom width of the super-junction trenches and improve the depletion of bottoms of the N-pillars, thus, increasing the breakdown voltage of the super-junction structure.

2. The super-junction structure according to claim 1, wherein the semiconductor substrate is a silicon substrate, the N-type epitaxial layer is an N-type silicon epitaxial layer, and the P-type materials forming the P-pillars are P-type silicon.

3. The super-junction structure according to claim 2, wherein the P-type silicon forming the P-pillars is a P-type silicon epitaxial layer formed through epitaxial growth.

4. A super-junction structure, wherein the super-junction structure is formed by a plurality of N-pillars and a plurality of P-pillars which are alternately arrayed, the P-pillars are formed by P-type materials filled in super-junction trenches, the super-junction trenches are formed in an N-type epitaxial layer, the N-pillars are formed by portions, between the P-pillars, of the N-type epitaxial layer, and the N-type epitaxial layer is formed on a surface of a semiconductor substrate;
   each said super-junction trench is formed by a bottom trench and a top trench which are stacked together;
   the bottom trenches and the top trenches have trapezoidal sections, a side angle of each said bottom trench is an apex angle of the trapezoidal section of the bottom trench, and a side angle of each said top trench is an apex angle of the trapezoidal section of the top trench;
   the side angle of each said bottom trench is greater than 90°, and a width of a bottom surface of each said bottom trench is greater than that of a top surface of the bottom trench;
   the side angle of each said top trench is smaller than 90°, and a width of a bottom surface of each said top trench is smaller than that of a top surface of the top trench;
   the N-type epitaxial layer is formed by a first N-type epitaxial layer and a second N-type epitaxial layer which are stacked together, the bottom trenches are formed in the first N-type epitaxial layer through secondary etching, the second N-type epitaxial layer is formed after the bottom trenches are filled with the P-type materials of the P-pillars, and the top trenches are formed in the second N-type epitaxial layer through primary etching; and
   the bottom surface of each said top trench is the top surface of the corresponding bottom trench, the whole super-junction trenches are each of a waisted structure, and the bottom trenches increase a bottom width of the super-junction trenches and improve the depletion of bottoms of the N-pillars, thus, increasing the breakdown voltage of the super-junction structure.

5. The super-junction structure according to claim 4, wherein the primary etching and the secondary etching are dry etching.

6. The super-junction structure according to claim 5, wherein an etching angle for the primary etching is smaller than 90°, so that the side angle of each said top trench is smaller than 90°; and an etching angle for the secondary etching is greater than 90°, so that the side angle of each said bottom trench is greater than 90°.

7. The super-junction structure according to claim 4, wherein a distance between the top surface and the bottom surface of each said bottom trench is smaller than or equal to a distance between the top surface and the bottom surface of each said top trench.

8. A method for manufacturing a super-junction structure, comprising the following steps:
   Step 1, providing a semiconductor substrate formed with an N-type epitaxial layer on a surface and defining formation areas of the super-junction trenches by photolithography process;
   Step 2, carrying out primary etching according to the photolithography process definition from a side of the N-type epitaxial layer spaced from and opposing the semiconductor substrate to form top trenches in the N-type epitaxial layer, wherein a side angle of each said top trench is smaller than 90°, a width of a bottom surface of each said top trench is smaller than that of a top surface of the top trench, each said top trench has a trapezoidal section, and the side angle of each said top trench is an apex angle of the trapezoidal section of the top trench;

the primary etching is dry etching;

an etching angle for the primary etching is smaller than 90°, so that the side angle of each said top trench is smaller than 90°;

Step 3, carrying out secondary etching from the side of the N-type epitaxial layer spaced from and opposing the semiconductor substrate to form bottom trenches in portions, at bottoms of the top trenches, of the N-type epitaxial layer, and stacking the bottom trenches and the top trenches together to form the super junction trenches;

wherein, a side angle of each said bottom trench is greater than 90°, a width of a bottom surface of each said bottom trench is greater than that of a top surface of the bottom trench, the bottom surface of each said top trench is the top surface of the corresponding bottom trench;

each said bottom trench has a trapezoidal section, and the side angle of each said bottom trench is an apex angle of the trapezoidal section of the bottom trench;

the secondary etching is dry etching;

an etching angle for the secondary etching is greater than 90°, so that the side angle of each said bottom trench is greater than 90°; and Step 4, filling the super-junction structures with P-type materials, wherein P-pillars are formed by the P-type materials filled in the super-junction trenches from the side of the N-type epitaxial layer spaced from and opposing the semiconductor substrate, N-pillars are formed by portions, between the P-pillars, of the N-type epitaxial layer, and the N-pillars and the P-pillars are alternately arrayed to form a super-junction structure;

wherein, the whole super-junction trenches are each of a waisted structure, and the bottom trenches increase a bottom width of the super-junction trenches and improve the depletion of bottoms of the N-pillars, thus, increasing the breakdown voltage of the super-junction structure.

9. A method for manufacturing a super-junction structure, comprising the following steps:

Step 1, providing a semiconductor substrate formed with a first N-type epitaxial layer on a surface and defining formation areas of the super-junction trenches by photolithography process;

Step 2, carrying out secondary etching according to the photolithography process definition to form bottom trenches in the first N-type epitaxial layer, wherein a side angle of each said bottom trench is greater than 90°, a width of each said bottom trench is greater than that of a top surface of the bottom trench, each said bottom trench has a trapezoidal section, and the side angle of each said bottom trench is an apex angle of the trapezoidal section of the bottom trench;

Step 3, filling the bottom trenches with P-type materials;

Step 4, forming a second N-type epitaxial layer through epitaxial growth on a surface of the first N-type epitaxial layer, and stacking the first N-type epitaxial layer and the second N-type epitaxial layer together to form an N-type epitaxial layer;

Step 5, carrying out primary etching according to the photolithography process's definition to form top trenches in the second N-type epitaxial layer, wherein a side angle of each said top trench is smaller than 90°, a width of a bottom surface of each said top trench is smaller than that of a top surface of the top trench, each said top trench has a trapezoidal section, and the side angle of each said top trench is an apex angle of the trapezoidal section of the top trench;

wherein, the bottom surface of each said top trench is the top surface of the corresponding bottom trench, and the bottom trenches and the top trenches are stacked to form the super-junction trenches; and Step 6, filling the top trenches with P-type materials, wherein P-pillars are formed by the P-type materials filled in the super-junction trenches, N-pillars are formed by portions, between the P-pillars, of the N-type epitaxial layer, and the N-pillars and the P-pillars are alternately arrayed to form a super-junction structure;

wherein, the whole super-junction trenches are each of a waisted structure, and the bottom trenches increase a bottom width of the super-junction trenches and improve the depletion of bottoms of the N-pillars, thus, increasing the breakdown voltage of the super-junction structure.

10. The method for manufacturing a super-junction structure according to claim 8, wherein the semiconductor substrate is a silicon substrate, and the N-type epitaxial layer is an N-type silicon epitaxial layer.

11. The method for manufacturing a super-junction structure according to claim 10, wherein the P-type materials of the P-pillars are a P-type silicon epitaxial layer.

12. The method for manufacturing a super-junction structure according to claim 9, wherein the primary etching and the secondary etching are dry etching.

13. The method for manufacturing a super-junction structure according to claim 12, wherein an etching angle for the primary etching is smaller than 90°, so that the side angle of each said top trench is smaller than 90°; and an etching angle for the secondary etching is greater than 90°, so that the side angle of each said bottom trench is greater than 90°.

14. The method for manufacturing a super-junction structure according to claim 13, wherein an etching device used for the primary etching and an etching device used for the secondary etching are of different types, and after the primary etching is completed, the semiconductor substrate needs to be transferred into the etching device used for the secondary etching so as to carry out the secondary etching.

15. The super-junction structure according to claim 1, wherein a distance between the top surface and the bottom surface of each said bottom trench is smaller than or equal to a distance between the top surface and the bottom surface of each said top trench.

16. The super-junction structure according to claim 1, wherein each P-pillar is etched partially through the N-type epitaxial layer providing a portion of the N-type epitaxial layer between the bottom of each bottom trench and the surface of the semiconductor substrate.

17. The super-junction structure according to claim 1, wherein each P-pillar is formed by filling the P-type materials in the super-junction trenches from the side of the N-type epitaxial layer spaced from and opposing the semiconductor substrate.

18. The super-junction structure according to claim 1, wherein each P-pillar is formed by filling simultaneously the top trench and bottom trench of each P-pillar with the P-type materials.

19. The method for manufacturing a super-junction structure according to claim 8, wherein each P-pillar is etched partially through the N-type epitaxial layer providing a portion of the N-type epitaxial layer between the bottom of each bottom trench and the surface of the semiconductor substrate.

20. The method for manufacturing a super-junction structure according to claim 8, further comprising filling simultaneously the top trench and bottom trench of each P-pillar with the P-type materials.

\* \* \* \* \*